(12) United States Patent
Chen et al.

(10) Patent No.: US 7,022,570 B2
(45) Date of Patent: *Apr. 4, 2006

(54) METHODS OF FORMING HEMISPHERICAL GRAINED SILICON ON A TEMPLATE ON A SEMICONDUCTOR WORK OBJECT

(75) Inventors: Guoqing Chen, Boise, ID (US); James Pan, Colorado Springs, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/943,337

(22) Filed: Sep. 17, 2004

(65) Prior Publication Data

US 2005/0032326 A1     Feb. 10, 2005

Related U.S. Application Data

(60) Continuation of application No. 10/174,696, filed on Jun. 18, 2002, now Pat. No. 6,828,193, which is a division of application No. 09/303,385, filed on May 1, 1999, now Pat. No. 6,544,842.

(51) Int. Cl.
H01L 21/8242 (2006.01)

(52) U.S. Cl. ............. 438/255; 438/398; 438/665; 438/704; 438/723

(58) Field of Classification Search ........... 438/255, 438/398, 665, 704, 723, 735
See application file for complete search history.

(56) References Cited

U.S. PATENT DOCUMENTS

| 4,127,437 A | 11/1978 | Bersin et al. ............ 438/743 |
| 4,749,440 A | 6/1988 | Blackwood et al. ....... 438/706 |
| 4,796,562 A | 1/1989 | Brors et al. .............. 118/725 |
| 4,996,627 A | 2/1991 | Zias et al. ............... 361/283.4 |
| 5,039,349 A | 8/1991 | Schoeppel ................. 134/26 |
| 5,129,955 A | 7/1992 | Tanaka ..................... 134/2 |
| 5,209,803 A | 5/1993 | Powell ..................... 156/345 |

(Continued)

OTHER PUBLICATIONS

Peter Van Zant, *Microchip Fabrication: A practical Guide To Semiconductor Processing*; 3rd Edition, McGraw Hill, 1997; pp. 174-189 & 259-283.

(Continued)

*Primary Examiner*—Hsien-Ming Lee
(74) *Attorney, Agent, or Firm*—Ganz Law P.C.

(57) ABSTRACT

The present invention provides a method of preparing a surface of a silicon wafer for formation of HSG structures. The method contemplates providing a wafer having at least one HSG template comprising polysilicon formed in BPSG, the HSG template being covered by silicon dioxide. The wafer is treated with a cleaning agent to clean the surface of the wafer. Next, the wafer is treated with a conditioning agent. The conditioning agent removes native oxide from the HSG template without excessively etching structural BPSG. Preferably, the conditioning agent also removes a thin layer of polysilicon on the HSG template. The wafer is then transferred to a process chamber for HSG formation.

42 Claims, 2 Drawing Sheets

U.S. PATENT DOCUMENTS

| | | | | |
|---|---|---|---|---|
| 5,211,796 | A | 5/1993 | Hansen | 156/345 |
| 5,234,540 | A | 8/1993 | Grant et al. | 216/63 |
| 5,259,888 | A | 11/1993 | McCoy | 134/2 |
| 5,271,798 | A | 12/1993 | Sandhu et al. | 438/745 |
| 5,290,361 | A | 3/1994 | Hayashida et al. | 134/2 |
| 5,294,568 | A | 3/1994 | McNeilly et al. | 438/706 |
| 5,350,489 | A | 9/1994 | Muraoka | 216/83 |
| 5,439,553 | A | 8/1995 | Grant et al. | 216/58 |
| 5,498,293 | A | 3/1996 | Ilardi et al. | 134/3 |
| 5,571,375 | A | 11/1996 | Izumi et al. | 438/743 |
| 5,634,974 | A | 6/1997 | Weimer et al. | 117/103 |
| 5,759,262 | A | 6/1998 | Weimer et al. | 117/88 |
| 5,783,495 | A | 7/1998 | Li et al. | 438/738 |
| 5,797,195 | A | 8/1998 | Huling et al. | 34/404 |
| 6,063,712 | A * | 5/2000 | Gilton et al. | 438/756 |
| 6,083,849 | A * | 7/2000 | Ping et al. | 438/753 |
| 6,165,841 | A * | 12/2000 | Kim et al. | 438/255 |
| 6,828,193 | B1 * | 12/2004 | Chen et al. | 438/255 |
| 2002/0011257 | A1 * | 1/2002 | Degendt et al. | 134/3 |

OTHER PUBLICATIONS

B. Witowsky, et al., *Characterization of an Anhydrous HF Pre-Gate Oxidation Etching Process*; published in Proceedings of the Second International Symposium on Cleaning Technology in Semiconductor Device Manufacturing, vol. 92-12, pp. 372-408; undated.

Peter Singer, *Wafer Cleaning Making the Transition to Surface Engineering*; published by Semiconductor International, the Industry's Source Book for Processing Assembly & Testing, Oct. 1995, pp. 86-92.

*Industry News*; published by Semiconductor International, The Industry's Source Book for Processing Assembly & Testing, Sep. 1995, pp. 18 & 21.

Nobuhiro, et al., *Gas-Phase Selective Etching of Native Oxide*; published by IEEE Transactions on Electron Devices, Jan. 1990, vol. 31, No. 1, pp. 107-115.

Werner Kern and David A. Puotinen, *Cleaning Solutions Based on Hydrogen Peroxide for use in Silicon Semiconductor Technology*; published by RCA Review, Jun. 1970, vol. 31, No. 2, pp. 188-207.

Mark Jenson and Dan Syverson, *BPSG to Thermal Oxide Etch Selectivity for Contact Clean Applications*; Technical Report 362, published by FSI International, Jan. 29, 1991, pp. 1-9.

* cited by examiner

METHODS OF FORMING HEMISPHERICAL GRAINED SILICON ON A TEMPLATE ON A SEMICONDUCTOR WORK OBJECT

This invention claims the benefit and a continuation of U.S. application Ser. No. 10/174,696 entitled "Methods Of Forming Hemispherical Grained Silicon On A Template On A Semiconductor Work Object", filed Jun. 18, 2002 now U.S. Pat. No. 6,828,193 which is a divisional of U.S. application Ser. No. 09/303,385, entitled "Method Of Forming Hemispherical Grained Silicon On A Template On A Semiconductor Work Object", filed May 1, 1999now U.S. Pat. No. 6,544,842, the entire disclosures of which are hereby incorporated by reference as if set forth in their entireties for all purposes.

BACKGROUND OF THE INVENTION

The present invention relates to a method of cleaning and conditioning a semiconductor work object, such as a silicon wafer, so that subsequent process steps produce desired results. More particularly, the present invention provides a method of cleaning and etching a wafer so that deposition of amorphous silicon ("a-Si") on the wafer produces good formations of Hemispherical Grained Silicon ("HSG").

HSG formations enhance the storage capacitance in storage devices such as Dynamic Random Access Memory Arrays ("DRAMS"). Methods for forming HSG are described, for example, in U.S. Pat. Nos. 5,634,974 and 5,759,262, which are hereby incorporated by reference as if set forth in their entirety. More particularly, these patents describe a method of seeding and annealing a-Si on a polysilicon template on a wafer to form HSG. The polysilicon template may be formed in a layer of oxide material such as BPSG. When HSG is formed on the polysilicon template, it becomes the bottom plate of a capacitor device on the wafer.

During wafer transfer steps, a native oxide layer can form on the polysilicon template. As described in the aforementioned patents, the formation of a native oxide on a wafer's surface during wafer transfer steps causes significant problems in forming HSG structures on a wafer. This is because HSG formation is very sensitive to surface conditions. If the oxide layer is not removed or inadequately removed, it can impede the seeding step of the seeding/annealing process in HSG formation.

A persisting problem in HSG formation process is that existing process steps do not adequately etch the undesired oxide materials from the wafer. Poor, irregularly shaped HSG formations result if the HSG process is not conducted on clean, properly prepped wafers. There are further problems as well.

Existing techniques do not adequately passivate the wafer surface after etching. Passivation inhibits the reformation of native oxide. Another etch-related problem is that conventional etching techniques do not have acceptable selectivity ratios for the different materials present during HSG formation. This means either under-etching or over-etching of targeted materials on the wafer or over-etching of untargeted materials on the wafer. Conventional cleaning and etching techniques may also leave the wafer's surface in poor condition for HSG seeding and annealing steps. A brief overview of the cleaning and etching techniques used on wafers will help illustrate these problems in more detail.

Wafer cleaning steps are usually carried out before etching. Cleaning and etching techniques are well known in the art. The formulation and use of wafer cleaning solutions and various etchants for silicon dioxide, silicon, and other materials such as silicon nitride are described, for example, in P. Van Zant, *Microchip Fabrication: A Practical Guide To Semiconductor Processing* ($3^{rd}$ ed. 1997) McGraw-Hill, New York, pp.174–189 & pp. 259–283, which is hereby incorporated by reference. Sulfuric acid based solutions are commonly used to remove particulate and inorganic contaminants from the surface of a wafer. Generally, sulfuric acid based solutions are used at a temperature of about 90° C.–130° C. Oxidants may be added to the solution so that organic residues are removed from the wafer surface. Suitable oxidants include hydrogen peroxide, ammonium persulfate, nitric acid, and ozone.

Wet etching is commonly used to remove oxide and other materials from a wafer: wafers are immersed in an etchant tank for a predetermined time, then rinsed, and dried. Etchants that remove a top layer of material without substantially attacking an underlying layer are said to have high selectivity. The selectivity of an etchant is expressed as the ratio of the etch rate of one layer of material to the etch rate of another layer of material. Typically, selectivity ratios for silicon dioxide/silicon are about 20–40, depending on the etch method used.

Silicon oxide is the most commonly etched material on a wafer. Hydrogen fluoride (HF) is an attractive etchant because it dissolves silicon dioxide without removing substrate silicon. (As discussed below, this selectivity is contrary to good HSG formation.) However, at room temperature, at high concentrations, HF etches oxide too fast (about 300 Å/second). Therefore, HF is typically mixed with water and/or an ammonium fluoride ($NH_4F$) buffering agent. When $NH_4F$ is in the solution, the solution is called a "buffered oxide etch" or "BOE" for short. It may be formulated at different strengths for different etch rates. BOEs may also include a wetting agent to reduce the surface tension of the etchant. One example BOE is an aqueous solution of HF and $NH_4F$ (1:8) at room temperature. The etch rate is about 700 Å/min. A more aggressive etchant for silicon dioxide is acetic acid and $NH_4F$ (2:1) at room temperature, which has an etch rate of about 1000 Å/min. Different etchants may be used to etch other material deposited on a wafer. For example, aqueous mixtures of nitric acid ($HNO_3$) and HF have been used to etch polysilicon deposited on a wafer.

At least the following etchants have been used to remove the oxide layer from an HSG template prior to introducing the wafer into the seeding and annealing steps: (1) 100:1 wt. % HF solution; (2) HF vapor; and (3) unheated HF/TMAH solution. Unfortunately, these etchants suffer from the problems mentioned above: they may not etch polysilicon, or they under-etch or over-etch features on the wafer, or they do not condition a wafer well for seeding and annealing of HSG. For example, 100:1 HF and unheated HF/TMAH solutions are generally effective at etching a native oxide layer to expose the polysilicon template. However, these solutions do not etch the underlying polysilicon layer to any appreciable degree, at least not without over-etching oxide layers or rendering the polysilicon surface in an unsuitable condition for HSG formation. Still other etchants are problematic to use. For example, HF vapor etchants are not only highly aggressive (especially on BPSG) and difficult to control, but they also require more complicated application and containment equipment than required for etchant in solutions. HF vapor systems may also pose hazards to workers.

Another disadvantage of conventional etchants and methods is that they may not passivate the surface of the wafer adequately. Passivation inhibits the reformation of native oxide on the wafer that could occur during staging between process steps. This means shortened staging times between processing steps. Longer staging times are desirable to accommodate the lag between the cleaning and etching steps and the HSG formation steps.

For the foregoing reasons, there is a significant need for improved methods for cleaning and etching methods. The etchants used in such methods must etch selectivity ratios that are not too high or low and must leave the wafer in good condition for HSG formation. They should also passivate the wafer surface to inhibit reformation of oxide material during staging times.

SUMMARY OF THE INVENTION

The present invention overcomes the disadvantages of the prior art by doing one or more of the following:

Cleaning the surface of a wafer without disrupting the integrity of HSG template.

Etching native oxide from an HSG template without over-etching other structures on the wafer.

Conditioning the HSG template for HSG formation by removing a thin layer of the HSG template.

Passivating the surface of the wafer to inhibit reformation of native oxide and increase staging time for the wafer.

One embodiment of the present invention is directed to a method of preparing a surface of a semiconductor work object for formation of HSG structures, comprising: providing a work object having at least one HSG template; treating the work object with a cleaning agent to clean the surface of the wafer; treating the cleaned work object with a conditioning agent to condition the template for HSG formation; and directly transferring the conditioned work object to HSG seeding and annealing process steps without a rinse step following treatment with the conditioning agent.

Another embodiment of the present invention is directed to a method of forming HSG structures on a silicon wafer, comprising: providing a wafer having at least one HSG template comprising polysilicon; treating the wafer with a cleaning agent to clean the surface of the wafer; treating the cleaned wafer with a conditioning agent to condition the template for HSG formation; directly transferring the conditioned wafer to HSG seeding and annealing process steps.

Another embodiment of the present invention is directed to a method of preparing a surface of a wafer for formation of HSG structures, comprising: providing a wafer having at least one HSG template comprising polysilicon formed in BPSG on a silicon wafer, the HSG template being covered by silicon oxide; treating the wafer with a cleaning agent to clean the surface of the wafer; treating the cleaned wafer with a QE2 conditioning agent to condition the template for HSG formation until the silicon oxide layer and at least about 5 Å of polysilicon on the HSG template have been removed; and directly transferring the conditioned work object to HSG annealing and seeding process steps.

Another embodiment of the present invention is directed to a method of preparing a surface of a wafer for formation of HSG structures, comprising: providing a wafer having at least one HSG template comprising polysilicon formed in BPSG on the wafer; treating the wafer with a cleaning agent comprising a solution of sulfuric acid and an oxidant to clean the surface of the wafer; treating the cleaned wafer with a conditioning agent comprising ammonium fluoride and phosphoric acid to condition the template for HSG formation; and directly transferring the conditioned work object to HSG seeding and annealing process steps.

Another embodiment of the present invention is directed to a method of forming HSG structures on wafer, comprising: providing a wafer having at least one HSG template comprising polysilicon; treating the cleaned wafer with a conditioning agent to condition the template for HSG formation, the conditioning agent removing a predetermined amount of polysilicon from the HSG template; and transferring the conditioned wafer to HSG seeding and annealing process steps.

Another embodiment of the present invention is directed to a method of forming HSG structures on a wafer, comprising: providing a wafer having at least one HSG template comprising polysilicon; treating the cleaned wafer with a conditioning agent to condition the template for HSG formation, the conditioning agent having a pH of about 4.0–7.5 and an etch selectivity ratio for BPSG to silicon dioxide of about 1 to about 2, the conditioning agent removing at least 5 Å of polysilicon from the HSG template; and transferring the conditioned wafer to HSG seeding and annealing process steps.

The cleaning agent used in the various embodiments of the present invention may be a conventional wafer cleaning solution, such as $H_2SO_4$ with either $H_2O_2$ or $O_3$.

The conditioning agent used in the various embodiments of the present invention may be an aqueous solution capable of etching oxide and polysilicon to a predetermined degree. Preferably, such solution has a pH of about 4.0 to about 7.5. Preferably, the conditioning agent includes a fluorine component. The fluorine component may be provided by ammonium fluoride or hydrogen fluoride, among other things. Preferably, ammonium fluoride is used in a solution with and a strong acid, the solution having a pH of about 4.0 to about 7.5. The strong acid may be selected from the group of phosphoric acid, hydrogen fluoride, and hydrochloric acid. The conditioning agent may also comprise an HF/TMAH solution heated above about 30° C. Preferably the HF/TMAH conditioning agent is heated between about 30° C. to about 45° C. More preferably, it is heated to about 36° C. The conditioning agent may also comprise a solution of nitric acid ($HNO_3$) and HF or HCl.

Preferably the conditioning agents used in the present invention have an etch selectivity ratio for BPSG to silicon dioxide that is about 1 to about 2. A preferred conditioning agent sold under the brand name QE2 has an etch selectivity ratio of about 1.5 to about 1.6.

Preferably, the conditioning agents of the embodiments of the present invention remove at least about 5 Å polysilicon to condition the wafer for good HSG formation. Good HSG formation should also result if at least 10 Å of polysilicon is removed. Good HSG formation should also result if at least 20 Å of polysilicon is removed. Generally, good HSG formation should also result from removal of about 5 Å or 10 Å to about 20 Å of polysilicon.

A work object treated according to the embodiments of the present invention may have a staging time of at least about one-hour between treatment with a conditioning agent and transfer to HSG seeding and annealing steps.

Preferably, in the embodiments of the present invention, the wafer is directly transferred, without rinsing, from the conditioning agent step to the HSG seeding and annealing process steps.

The HSG templates used in the embodiments of the present may take any shape. A preferred shape capacitors used in DRAM storage devices comprises a substantially container shaped structure for forming the bottom plate of the capacitor device.

DETAILED DESCRIPTION OF THE INVENTION

The present invention provides a novel method for treating a semiconductor work object so that it is suitable for use in HSG process steps. As used herein, "work object" means wafers (production, dummy, or pmon), die and packaged parts, incorporating, in whole or part, silicon substrates, and other known or discovered semiconductor materials, components, and assemblies, including, for example, silicon-on-insulator (SOI), silicon-on-sapphire (SOS), thin film transistor (TFT) materials, or germanium, periodic group III-IV materials, II-VI materials, hetero-materials (II, III, V, VI), and conductive glasses.

It will be apparent to persons of skill in the art that the present invention is not necessarily limited to any particular kind of work object. However, to illustrate the principles of the present invention, the following discussion, unless otherwise noted, will be in terms of a silicon-based wafer as the work object.

Figure 1:
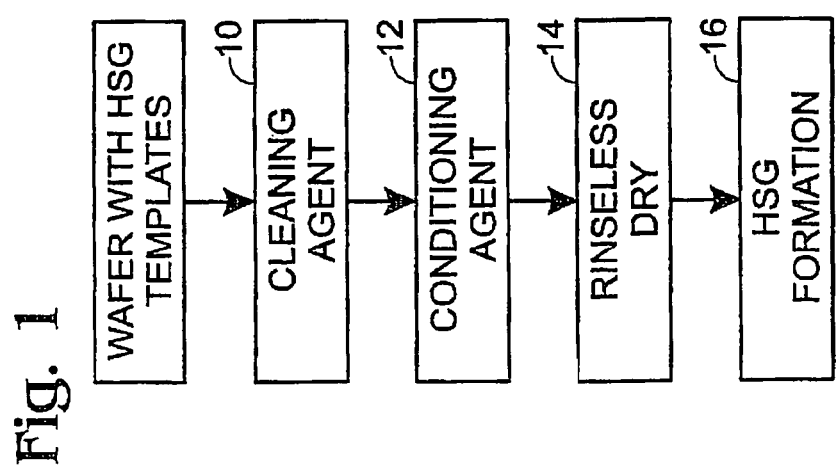
FIG. 1 is a flow chart of steps defining one or more aspects of the present invention.

FIG. 1 is a flow chart of steps 10–16 that define one or more aspects of the present invention. Steps 10–14 relate to pre-treating a wafer so that it is ready for HSG formation in step 16. Generally, step 16 includes the steps of seeding and annealing to form HSG. Preferably, an RTCVD process chamber is used in the process of forming HSG.

As a matter of convenience, steps 10–14, unless otherwise noted, may be performed at about 1 ATM and at about room temperature, or they may be performed at other ambient conditions in a fabrication facility. These steps may be carried out on a semi-automated wet bench. Step 16 may be carried out in any process chamber suitable for formation of HSG, including PECVD, LPCVD, RTCVD, and PVD process chambers, as noted in U.S. Pat. No. 5,759,262, previously incorporated by reference.

Figure 2:
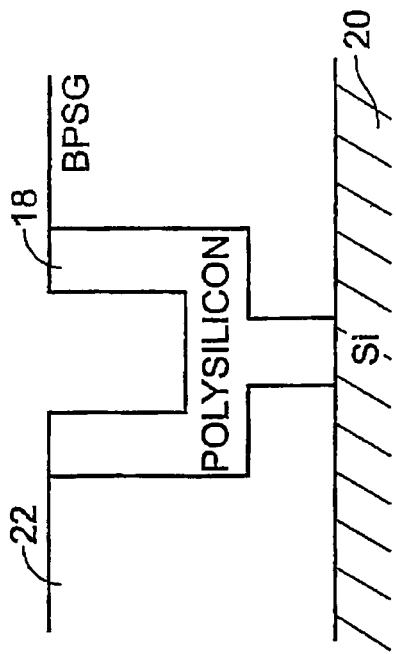
FIG. 2 is a cross-sectional illustration of a bottom plate being formed in a wafer for a container type capacitor structure prior to cleaning using the principles of this invention.

FIG. 2 is a cross-sectional illustration of a container-type capacitor structure 18 being formed on a silicon substrate 20. The container 18 represents the bottom plate (electrode) of the capacitor onto which HSG will be formed to enhance the capacitor's storage capacity. It will be apparent to persons skilled in the art that although the Figures depict only a single capacitor, this invention applies to the formation of a plurality of capacitors on a single wafer. It will also be apparent, that while this invention is generally in terms of a container-type capacitor structure, the principles will readily apply to other patterns on work-objects intended to receive HSG formations. Hereinafter, a patterned region on a wafer intended to receive HSG formations is referred to as an "HSG template".

An HSG template may be formed by well-known techniques. Referring to FIG. 2, a conductive material is deposited over a selectively etched layer 22 of dielectric material to form container 18. Container 18 is formed of the conductive material. Preferably, the conductive layer of material forming container 18 is polysilicon. FIG. 2 shows the container 18 after removal of the wafer's top layer of conductive material from the wafer's top surface, by for example, chemical-mechanical polishing (CMP). After polishing down the top surface of the conductive material, container 18 material remains in the well formed in dielectric layer 22, as illustrated in FIG. 2.

The dielectric layer 22 may be an un-doped or doped silicon dioxide material deposited on silicon wafer 20. A preferred dielectric material for layer 22 is BPSG (borophosphorus silicate glass). BPSG is a doped silicon dioxide oxide. Other possible dielectric materials include un-doped and doped silicon nitride material. The dielectric layer 22 is used structurally to support the HSG templates and to separate HSG capacitor cells to keep the cells from electrically shorting each other. For purposes of illustrating this invention, the dielectric layer 22 is generally described herein in terms of BPSG. It should be recognized, however, that other dielectric materials may also be suitable for use in dielectric layer 22.

Figure 3:
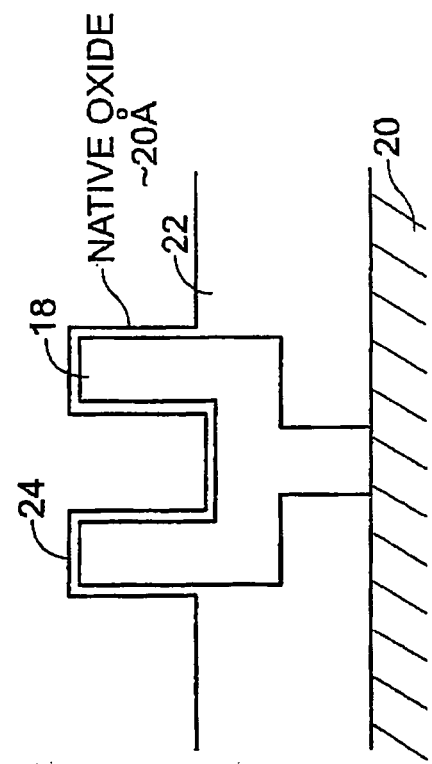
FIG. 3 shows the wafer of FIG. 2 after treatment to remove material surrounding the container structure, the exposed container now having a native oxide layer that is to be removed according to steps in the present invention.

FIG. 3 shows the wafer of FIG. 2 after treatment to etch dielectric layer 22. This treatment may be based on known etching methods. A suitable method for etching BPSG involves a wet etch using an aqueous solution of about 100:1 wt % HF. The etch exposes the walls of container structure 18, as shown in FIG. 3. After etching to remove the oxide material 22, a native oxide layer 24 may form on container 18.

Prior to introducing the wafer into HSG fabrication steps, the surface of the wafer must be cleaned of organic and other contaminants. The oxide material 24 must also be removed from the HSG template 18. Preferably, the surface of the wafer is also passivated to inhibit reformation of oxide on the wafer's surface during staging between process steps.

If such surfaces are not adequately cleaned and conditioned, HSG may form poorly on the HSG template. If the formations are too poor, the device may be defective, lowering production yields.

To avoid such problems and produce good formations, the present invention uses a novel method of cleaning and conditioning a wafer prior to HSG formation. To illustrate the principles of the present invention, the wafer of FIG. 3 may be treated according to steps 10–14 of FIG. 1. After these steps, the wafer may be introduced into step 16, HSG formation.

In step 10, a wafer surface with an HSG template is cleaned by a cleaning agent to remove organics or other contaminants from the wafer's surface. Wafer cleaning agents are well known. For example, sulfuric acid based solutions are commonly used to remove particulate and inorganic contaminants from the surface of a wafer surface. Generally, sulfuric acid based solutions are used at a temperature of about 90° C.–130° C. Oxidants may be added to the solution so that the solution also removes organic residues. Suitable oxidants include hydrogen peroxide, ammonium persulfate, nitric acid, and ozone. As previously noted above, the formulation and use of these cleaning solutions is well known to persons skilled in the art.

In selecting a suitable cleaning agent, the cleaning agent should not be so strong that it substantially disrupts the integrity of the HSG template. A preferred cleaning agent is, for example, a "Piranha" solution. Piranha cleaning agents are well known in the art. Typically, the Piranha solution comprises aqueous $H_2SO_4$ with either $H_2O_2$ or $O_3$. Piranha is carried out at about 120° C. at 1 ATM for about 5 minutes or until the wafer surface and HSG template have been acted on to a desired degree. This cleaning step removes inorganic and organic contaminates from the wafer's surface.

In step 12, the HSG template is etched with a conditioning agent to remove layer 24 of native silicon dioxide and preferably to remove a thin layer of polysilicon layer 18. The conditioning agent exposes and conditions the surface of the HSG template so that good HSG seeding and annealing result in subsequent steps. Removal of at least about 5 Å of the top layer of polysilicon from the HSG template is believed to result in good HSG formation. Generally, removal of at least about 5–20 Å of polysilicon should produce good results. The etch should be conducted without excessive etching of the remaining BPSG layer 22. Excessive etching of layer 22 may lead to poor integrity of the capacitor structures. A suitable etch ratio of BPSG to silicon dioxide is about 1.0 to about 2.0 so that there is not unacceptable loss of the BPSG layer. A preferable ratio is about 1.0.

This invention contemplates using different conditioning agents to remove native oxide and a thin layer of polysilicon without unacceptable etching of BPSG or other material. For example, the present invention contemplates using as a conditioning agent a solution of ammonium fluoride ($NH_4F$) with phosphoric acid ($H_3PO_4$), hydrogen fluoride (HF), hydrochloric acid (HCL), or another strong acid. Another conditioning agent contemplated by the present invention is a solution of HF or HCL with nitric acid ($HNO_3$). Generally, the conditioning agent should be formulated for a pH range of about 4.0–7.5. Preferably, the pH is adjusted to about 7.0.

A preferred conditioning agent for use in the present invention is a known solution sold under the brand name "QE2" by OLIN Corporation, Norwalk, Conn. QE2 is an aqueous solution containing about 40 wt. % $NH_4F$, about 1.0–1.3 wt. % phosphoric acid ($H_3PO_4$), and deionized water as the remainder. A QE2 etchant can etch BPSG at about 75 Å/min and silicon dioxide at about 48 Å/min. This gives a BPSG/oxide etch selectivity ratio of about 1.6. This ratio is considered a suitable ratio for the purposes of this invention. A QE2 conditioning agent etches the polysilicon stated above at about 20 Å/min.

Conveniently, the QE2 conditioning agent may be used without heating at about room temperature at about 1 ATM. However, the present invention is not limited to this temperature. The temperature may be in the range of about 15° C. to about 60° C. The process is carried out for about 1–5 minutes or until the oxide layers or other targeted layers have been etched to a desired degree. Temperatures at the lower end of the temperature range will require longer times. Times and temperatures may be adjusted to control how much polysilicon or other substrate material is etched. It is believed that the foregoing conditions of use applicable to a QE2 conditioning agent should also generally apply for the use of the other conditioning agents contemplated by the present invention. In any event, persons skilled in the art will recognize how to adjust such conditioning agents' formulation and how to use them to produce desired results.

A conditioning agent having a passivation agent is advantageous because the component transfers to the surface of the wafer to passivate it. The passivation agent keeps the surface from oxidizing, allowing a relatively long staging time before the wafer experiences significant oxidation. Fluorine and hydrogen from a QE2 conditioning agent are believed to transfer to the surface of the wafer to passivate it. It is expected that other conditioning agents with a fluorine component will produce similar results. A QE2 conditioning agent used according to the present invention should allow a staging time of at least about four hours between use of the conditioning agent and the HSG seeding and annealing process steps.

Another conditioning agent of the present invention is a heated aqueous solution of HF/TMAH (tetramethyl ammonium hydroxide). A preferred solution comprises about 0.5 wt. % HF and about 1.5 wt. % TMAH. This solution has a BPSG/thermal oxide etch selectivity of about 2:1. A conditioning agent based on HF/TMAH should be heated to at least about 30° C. when applied to the HSG template. Preferably, the conditioning agent is applied at a temperature of from about 30° C. to about 45° C. Preferably the temperature is about 36° C. Above 45° C., the solution may cause pitting in the polysilicon. It has been found that HF/TMAH solutions below about 30° C. do not etch effectively enough to result in good selective HSG formation. One reason may be that such solutions etch little or no polysilicon after etching the native oxide layer and/or they do not leave the surface of the wafer in a state conducive to HSG seeding and annealing.

After treatment with a conditioning agent, the wafer may be dried without rinsing. It is undesirable to rinse the wafer because common aqueous rinsing agents could promote the reformation of native oxide on the wafer, which would interfere with HSG formation. The wafer may be dried by transfer to a dryer. A suitable drying technique is at about room temperature in a Marangoni dryer. Other systems for drying wafers are well known in the art. After drying, the wafer surface is favorably conditioned for HSG formation. After the wafer is dried, the wafer may be transferred to an RTCVD system or other system suitable for producing HSG formations on the wafer. The transfer of the wafer directly to HSG formation process steps, without rinsing or further chemical processing, following use of the conditioning agent is hereinafter referred to as a "direct transfer" step.

Figure 4:
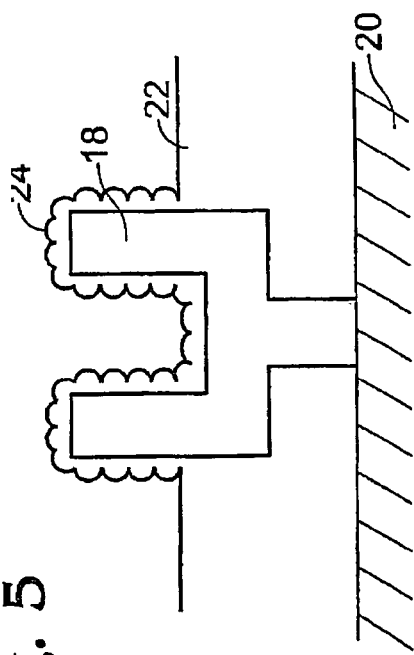
FIG. 4 is the wafer of FIG. 3 after treatment according to certain steps of the present invention.

FIG. 4 shows the wafer of FIG. 3 after steps 10–14 have been performed. At this stage, the native oxide has been removed, the wafer has been dried, and the surface passivated by a passivation agent, such as fluorine from the conditioning agent. The wafer is ready for HSG formation. Methods of forming HSG are described in U.S. Pat. Nos. 5,634,974 and 5,759,262, which were incorporated by reference above.

Figure 5:
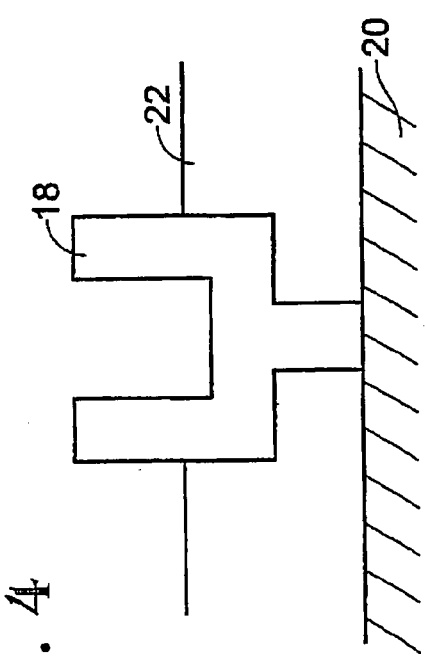
FIG. 5 shows the wafer of FIG. 4 after seeding and annealing steps to form HSG.
Figure 6:
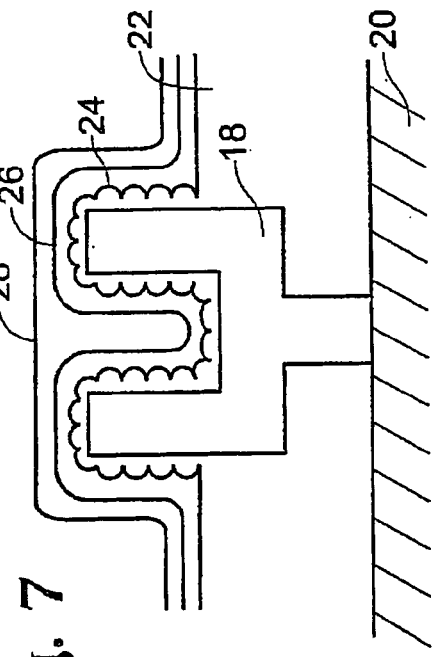
FIG. 6 shows the wafer of FIG. 5 after a dielectric layer has been applied over the HSG formation.
Figure 7:
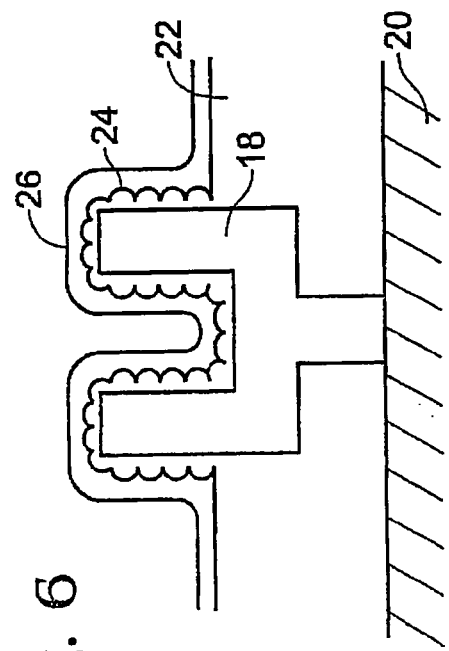
FIG. 7 shows the wafer of FIG. 6 after a layer of top plate material has applied over the dielectric layer, completing the capacitor structure.

FIG. 5 shows the wafer of FIG. 4 after seeding and annealing steps to form HSG 24 on the HSG template. FIG. 6 shows the wafer of FIG. 5 after a dielectric layer 26 has been applied over the HSG formation 24. FIG. 7 shows the wafer of FIG. 6 after a layer 28 of top plate (electrode) material has been applied over the dielectric layer 26. Layer 28 completes the capacitor structure.

Tests were conducted on silicon wafers with container-type polysilicon HSG templates formed in a layer of BPSG. The wafers were treated in accordance with the foregoing description using a Piranha cleaning agent; a QE2 conditioning agent at about room temperature or an HF/TMAH conditioning agent heated above 30° C.; and direct transfer without rinsing. The wafers were then introduced into seeding and annealing steps for HSG formations. The resulting HSG formations were consistently better than treatment with an etchant solution based on 100:1 HF or unheated (room temperature) HF/TMAH. It is has also been found that good HSG formations result if HF vapor is used as the conditioning agent.

Persons skilled in the art will recognize the foregoing description and embodiments are not limitations but examples. It will be recognized by persons skilled in the art that many modifications and variations to the present invention are possible that are still within the spirit and scope of the teachings and claims contained herein.

What is claimed:

1. A method of forming a semiconductor wafer with the formation of HSG structures, comprising:
   providing a work object with a surface having a polysilicon feature;
   treating the surface with a cleaning agent to clean the surface;
   treating the surface, before HSG formation, with a conditioning agent to condition the surface for HSG formation by removing a thin layer of polysilicon from the polysilicon feature;
   transferring the work object to HSG seeding and annealing process steps; and
   forming HSG on the work object.

2. The method of claim 1 wherein the conditioning agent is an aqueous solution having a pH of about 4.0 to about 7.5.

3. The method of claim 1 wherein the conditioning agent includes a fluorine component.

4. The method of claim 3 wherein the fluorine component is provided by ammonium fluoride.

5. The method of claim 3 wherein the fluorine component is provided by hydrogen fluoride.

6. The method of claim 1 wherein the conditioning agent comprises a solution of ammonium fluoride and a strong acid, the solution having a pH of between about 4.0 to about 7.5.

7. The method of claim 6 wherein the strong acid is selected from the group consisting of phosphoric acid, hydrogen fluoride, and hydrochloric acid.

8. The method of claim 7 wherein phosphoric acid is the strong acid.

9. The method of claim 2 wherein the conditioning agent comprises a solution of ammonium fluoride and phosphoric acid, the conditioning agent removing a predetermined amount of the polysilicon feature from the work object.

10. The method of claim 1 wherein the conditioning agent comprises HF/TMAH heated above about 30° C.

11. The method of claim 10 wherein the conditioning agent is heated between about 30° C. to about 45° C.

12. The method of claim 11 wherein the conditioning agent is heated to about 36° C.

13. The method of claim 1 wherein the conditioning agent comprises a solution of nitric acid ($HNO_3$) with HF or HCL.

14. The method of claim 1 wherein the cleaning agent comprises a solution of $H_2SO_4$) with $H_2O_2$ or $O_3$.

15. The method of claim 7 wherein the cleaning agent comprises a solution of $H_2SO_4$ with $H_2O_2$ or $O_3$.

16. The method of claim 1 wherein the conditioning agent's etch selectivity ratio for BPSG to silicon dioxide is about 1 to about 2.

17. The method of claim 16 wherein the etch selectivity ratio is about 1.5.

18. The method of claim 1 wherein the work object is directly transferred to the process chamber for HSG formation after a staging time of at least about one hour.

19. The method of claim 1 wherein the polysilicon feature comprises a substantially container shaped structure for forming a bottom plate of a container-type capacitor device.

20. The method of claim 1 wherein at least about 5 Å of polysilicon of the polysilicon feature on the work object is removed by the conditioning agent.

21. A method of forming a semiconductor wafer with the formation of HSG structures, comprising;
   providing a work object having a surface with plural polysilicon features, the polysilicon feature being covered by silicon oxide;
   treating the surface with a cleaning agent to clean the surface;
   treating the surface, before HSG formation, with a conditioning agent to condition the surface for HSG formation by removing a thin layer of polysilicon from the polysilicon feature until the silicon oxide layer and at least about 5 Å of the polysilicon features on the work object has been removed; the conditioning agent being an aqueous solution containing about 40 wt. % $NH_4F$, about 1.0–1.3 wt. % phosphoric acid ($H_3PO_4$), and deionized water as a remainder, and transferring the conditioned work object to HSG annealing and seeding process steps.

22. A method of forming HSG structures on a semiconductor wafer, comprising:
   providing a clean wafer having a surface with a polysilicon feature;
   treating the surface, before HSG formation, with a conditioning agent to condition the surface for HSG formation by removing a thin layer of polysilicon from the polysilicon feature, and
   transferring the conditioned wafer to HSG seeding and annealing process steps in which HSG is formed on the polysilicon feature.

23. The method of claim 22 wherein the conditioning agent is an aqueous solution having a pH of between about 4.0 to about 7.5.

24. The method of claim 22 wherein the conditioning agent includes a fluorine component.

25. The method of claim 24 wherein the fluorine component is provided by ammonium fluoride.

26. The method of claim 25 wherein the conditioning agent comprises an aqueous solution containing about 40 wt. % $NH_4F$, about 1.0–1.3 wt. % phosphoric acid ($H_3PO_4$), and deionized water as a remainder.

27. The method of claim 22 wherein the conditioning agent's etch selectivity ratio for BPSG to silicon dioxide is about 1 to about 2.

28. The method of claim 27 wherein the etch selectivity ratio is about 1.5.

29. The method of claim 22 wherein about 5 Å to about 20 Å of polysilicon is removed.

30. The method of claim 22 wherein at least about 10 Å of polysilicon is removed.

31. The method of claim 22 wherein between about 10 Å to about 20 Å of polysilicon is removed.

32. The method of claim 22 wherein at least about 20 Å of polysilicon is removed.

33. The method of claim 27 wherein between about 5 Å to about 20 Å of polysilicon is removed.

34. The method of claim 27 wherein at least about 10 Å of polysilicon is removed.

35. The method of claim 27 wherein between about 10 Å to about 20 Å of polysilicon is removed.

36. The method of claim 27 wherein at least about 20 Å of polysilicon is removed.

37. The method of claim 22 wherein the conditioning agent's etch selectivity ratio for BPSG to silicon dioxide is about 1 to about 2.

38. The method of claim 22 wherein the wafer is directly transferred from the conditioning agent step to the HSG seeding and annealing process steps.

39. A method of forming a semiconductor wafer having HSG structures, comprising:
- providing a work object having a surface with a polysilicon feature;
- treating the surface, before HSG formation, with a conditioning agent to condition the surface for HSG formation by removing a thin layer of polysilicon from the polysilicon feature, the conditioning agent having a pH of about 4.0–7.5 and an etch selectivity ratio for BPSG to silicon dioxide of about 1 to about 2, the conditioning agent removing at least 5 Å of polysilicon from the work object; and
- transferring the conditioned work object to HSG seeding an annealing process steps.

40. The method of claim 39 wherein at least about 10 Å of polysilicon is removed.

41. The method of claim 39 wherein the work object is directly transferred to HSG seeding and annealing process steps.

42. A method of forming a semiconductor work object with HSG structures, comprising:
- providing a work object having a surface with a polysilicon feature;
- treating the surface with a cleaning agent to clean the surface;
- treating the surface, before HSG formation, with a conditioning agent by removing a thin layer of polysilicon from the polysilicon feature, the conditioning agent comprising an aqueous solution having a pH of between about 4.0 to about 7.5 to condition the surface for HSG formation; and
- transferring the conditioned work object to HSG seeding and annealing process steps.

* * * * *